(12) United States Patent
Kerr et al.

(10) Patent No.: US 7,233,498 B2
(45) Date of Patent: Jun. 19, 2007

(54) MEDIUM HAVING DATA STORAGE AND COMMUNICATION CAPABILITIES AND METHOD FOR FORMING SAME

(75) Inventors: Roger S. Kerr, Brockport, NY (US); Timothy J. Tredwell, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 501 days.

(21) Appl. No.: 10/256,769

(22) Filed: Sep. 27, 2002

(65) Prior Publication Data

US 2004/0061994 A1    Apr. 1, 2004

(51) Int. Cl.
*H05K 1/14* (2006.01)

(52) U.S. Cl. .................. 361/737; 361/736; 361/761

(58) Field of Classification Search ........ 361/760–764, 361/736–737; 235/487–492; 257/690–697; 29/830, 846
See application file for complete search history.

(56) References Cited

U.S. PATENT DOCUMENTS

| | | | |
|---|---|---|---|
| 3,580,565 A | 5/1971 | Mallory et al. |
| 3,713,148 A | 1/1973 | Cardullo et al. |
| 3,835,301 A | 9/1974 | Barney |
| 4,075,018 A | 2/1978 | Custer |
| 4,129,855 A | 12/1978 | Rodrian |
| 4,178,183 A | 12/1979 | Ciurca, Jr. et al. |
| 4,208,210 A | 6/1980 | Sakai et al. |
| 4,247,758 A | 1/1981 | Rodrian |
| 4,270,853 A | 6/1981 | Hatada et al. |
| 4,270,854 A | 6/1981 | Stemme et al. |
| 4,600,280 A | 7/1986 | Clark |
| 4,663,625 A | 5/1987 | Yewen |
| 4,742,470 A | 5/1988 | Juengel |
| 4,806,958 A | 2/1989 | Momot et al. |
| 4,855,769 A | 8/1989 | Slavitter et al. |
| 4,880,325 A | 11/1989 | Ueda et al. |
| 4,905,029 A | 2/1990 | Kelley |
| 4,983,996 A | 1/1991 | Kinoshita |
| 4,990,092 A | 2/1991 | Cummings |
| 5,008,661 A | 4/1991 | Raj |
| 5,019,815 A | 5/1991 | Lemelson et al. |

(Continued)

FOREIGN PATENT DOCUMENTS

DE    200 14 076    10/2000

(Continued)

OTHER PUBLICATIONS

TEMIC Semiconductors TK5550, Read/Write Transponder, Transponder, TELEFUNKEN Semiconductors, Rev. A1, Apr. 30, 1997.

(Continued)

*Primary Examiner*—Tuan Dinh
(74) *Attorney, Agent, or Firm*—Roland R. Schindler, II

(57) ABSTRACT

A method for forming a medium is provided. In accordance with the method a base layer is provided. A material layer is formed on the base layer. The material layer has void. A transponder having a memory is positioned in the void. A medium is also provided. The medium has a base layer and a material layer having a void. A transponder having a memory is positioned in the void.

12 Claims, 9 Drawing Sheets

U.S. PATENT DOCUMENTS

| | | | |
|---|---|---|---|
| 5,030,544 A | | 7/1991 | Olbrechts et al. |
| 5,049,898 A | | 9/1991 | Arthur et al. |
| 5,049,904 A | | 9/1991 | Nakamura et al. |
| 5,059,126 A | | 10/1991 | Kimball |
| 5,078,523 A | | 1/1992 | McGourty et al. |
| 5,104,247 A | | 4/1992 | Ohshima |
| 5,105,190 A | | 4/1992 | Kip et al. |
| 5,184,152 A | | 2/1993 | French |
| 5,185,315 A | | 2/1993 | Sparer |
| 5,196,846 A | | 3/1993 | Brockelsby et al. |
| 5,196,862 A | | 3/1993 | Fisher, Sr. |
| 5,208,450 A | * | 5/1993 | Uenishi et al. ............. 235/492 |
| 5,224,784 A | | 7/1993 | Haftmann et al. |
| 5,266,968 A | | 11/1993 | Stephenson |
| 5,266,975 A | | 11/1993 | Mochizuki et al. |
| 5,268,708 A | | 12/1993 | Harshbarger et al. |
| 5,290,190 A | | 3/1994 | McClanahan |
| 5,297,881 A | | 3/1994 | Ishiyama |
| 5,305,020 A | | 4/1994 | Gibbons et al. |
| 5,310,999 A | | 5/1994 | Claus et al. |
| 5,313,235 A | | 5/1994 | Inoue et al. |
| 5,318,370 A | | 6/1994 | Nehowig |
| 5,323,704 A | | 6/1994 | Fraczek |
| 5,331,338 A | | 7/1994 | Mager |
| 5,342,671 A | | 8/1994 | Stephenson |
| 5,347,274 A | | 9/1994 | Hassett |
| 5,365,312 A | | 11/1994 | Hillman et al. |
| 5,385,416 A | | 1/1995 | Maekawa et al. |
| 5,398,257 A | | 3/1995 | Groenteman |
| 5,412,192 A | * | 5/1995 | Hoss ......................... 235/380 |
| 5,426,011 A | | 6/1995 | Stephenson |
| 5,430,441 A | | 7/1995 | Bickley et al. |
| 5,455,617 A | | 10/1995 | Stephenson et al. |
| 5,491,327 A | | 2/1996 | Saroya |
| 5,491,468 A | | 2/1996 | Everett et al. |
| 5,493,385 A | | 2/1996 | Ng |
| 5,504,507 A | | 4/1996 | Watrobski et al. |
| 5,513,920 A | | 5/1996 | Whritenor et al. |
| 5,516,590 A | | 5/1996 | Olmstead et al. |
| 5,521,663 A | | 5/1996 | Norris, III |
| 5,528,222 A | | 6/1996 | Moskowitz et al. |
| 5,528,377 A | | 6/1996 | Hutcheson |
| 5,530,702 A | | 6/1996 | Palmer et al. |
| 5,532,727 A | | 7/1996 | Agano et al. |
| 5,537,920 A | | 7/1996 | Hasegawa et al. |
| 5,547,501 A | | 8/1996 | Maruyama et al. |
| 5,559,578 A | | 9/1996 | Umeda et al. |
| 5,562,352 A | | 10/1996 | Whritenor et al. |
| 5,565,906 A | | 10/1996 | Schoon |
| 5,574,519 A | | 11/1996 | Manico et al. |
| 5,584,070 A | | 12/1996 | Harris et al. |
| 5,598,201 A | | 1/1997 | Stodder et al. |
| 5,600,350 A | | 2/1997 | Cobbs et al. |
| 5,600,352 A | | 2/1997 | Knierim et al. |
| 5,606,347 A | | 2/1997 | Simpson |
| 5,610,635 A | | 3/1997 | Murray et al. |
| 5,620,265 A | | 4/1997 | Kondo |
| 5,625,391 A | | 4/1997 | Hirabayashi et al. |
| 5,644,557 A | | 7/1997 | Akamine et al. |
| 5,647,679 A | | 7/1997 | Green et al. |
| 5,661,515 A | | 8/1997 | Hevenor et al. |
| 5,713,288 A | | 2/1998 | Frazzitta |
| 5,721,992 A | | 2/1998 | Chovanes |
| 5,755,519 A | | 5/1998 | Klinefelter |
| 5,757,021 A | | 5/1998 | Dawaele |
| 5,757,394 A | | 5/1998 | Gibson et al. |
| 5,768,633 A | | 6/1998 | Allen et al. |
| 5,774,639 A | | 6/1998 | Schildkraut et al. |
| 5,774,752 A | | 6/1998 | Patton et al. |
| 5,812,156 A | | 9/1998 | Bullock et al. |
| 5,842,118 A | | 11/1998 | Wood, Jr. |
| 5,913,088 A | | 6/1999 | Moghadam et al. |
| 5,914,671 A | | 6/1999 | Tuttle |
| 6,036,099 A | * | 3/2000 | Leighton ..................... 235/488 |
| 6,075,950 A | | 6/2000 | Stephenson |
| 6,099,178 A | | 8/2000 | Spurr et al. |
| 6,100,804 A | * | 8/2000 | Brady et al. ............. 340/572.7 |
| 6,106,166 A | | 8/2000 | Spurr et al. |
| 6,173,119 B1 | | 1/2001 | Manico et al. |
| 6,227,643 B1 | | 5/2001 | Purcell et al. |
| 6,263,310 B1 | | 7/2001 | Loudermilk |
| 6,282,819 B1 | | 9/2001 | Gu |
| 6,404,643 B1 | * | 6/2002 | Chung ........................ 361/737 |
| 6,595,426 B1 | * | 7/2003 | Brunet et al. ............... 235/487 |
| 2001/0014377 A1 | | 8/2001 | Babb et al. |
| 2002/0101619 A1 | | 8/2002 | Tsubaki et al. |

FOREIGN PATENT DOCUMENTS

| | | |
|---|---|---|
| FR | 2 775 533 | 9/1999 |
| JP | 06044265 | 7/1992 |
| NL | A 9400392 | 3/1994 |
| WO | WO 98/09252 | 3/1998 |
| WO | WO 98/52762 | 11/1998 |

OTHER PUBLICATIONS

TEMIC Semiconductors e5550, Standard Read/Write Identification IC, TELEFUNKEN Semiconductors, Rev. A3, Mar. 17, 1998.

Multi-Technology Card Guide, HID Corporation, An ASSA ABLOY Group Company.

ProxCard® II, Proximity Acces Card, HID Corp. An ASSA ABLOY Group Company, © 2001.

Protective Security Management, HID Prox Cards, www.prosecman.com.

Atmel Smart Card ICs, Atmel Corp., San Jose, CA.

Tag-it—Moving Concepts to Rality, Published by Texas Instruments, Dallas, Texas, 2000.

Making RFID work for you: An Industry Roundtable hosted by Texas Instruments at NACS-Tech 1998, Published by Texas Instruments, Dallas, Texas, 2000 www.ti.com/tiris/docs/manuals/whtPapers/manuf-dist.pdf.

TheCutting Edge of RFID Technology and Applications for Manufacturing and Distribution, by d'Hont, Published by Texas Instruments, Dallas, Texas, 2000 www.ti.com/tiris/docs/manuals/whtPapers/manuf-dist.pdf.

Latest Generation Technology for Immobilizer Systems, by Knebelkamp et al. Published by Texas Instruments, Dallas, Texas www.ti.com.tiris.docs.manuals/whtPapers/immobilizer.pdf.

* cited by examiner

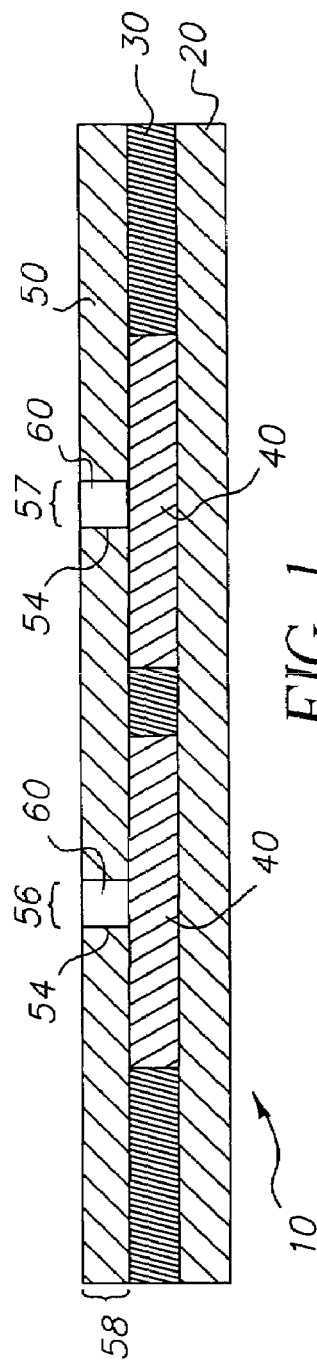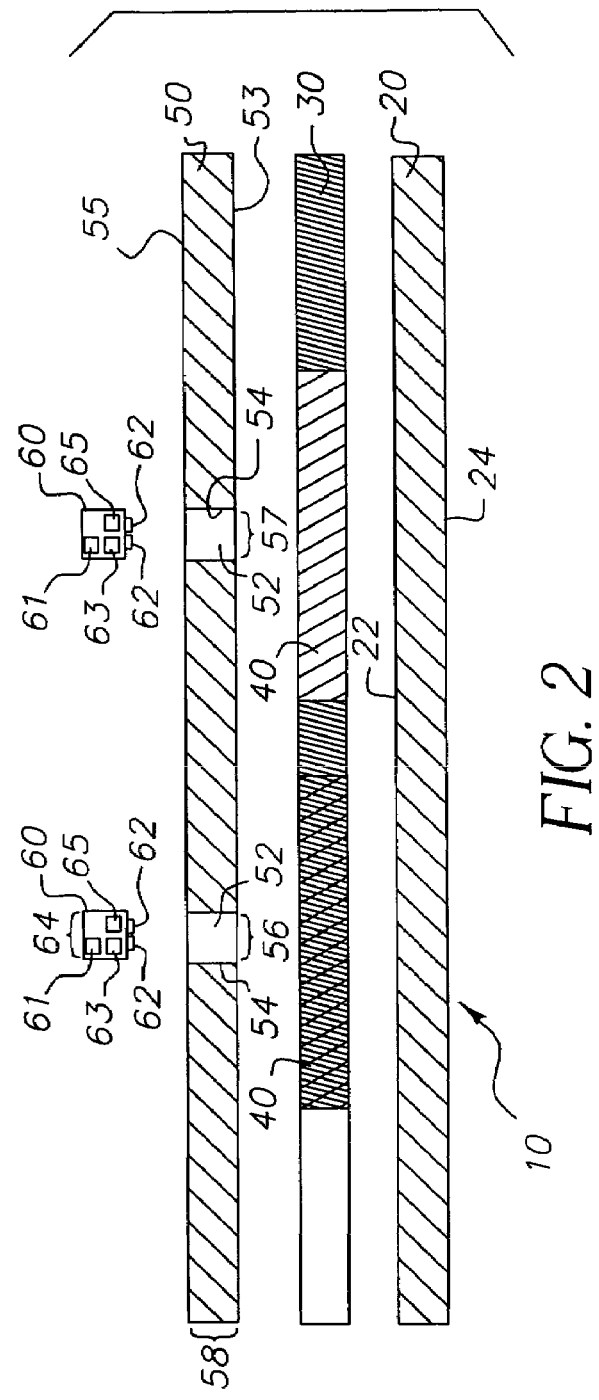

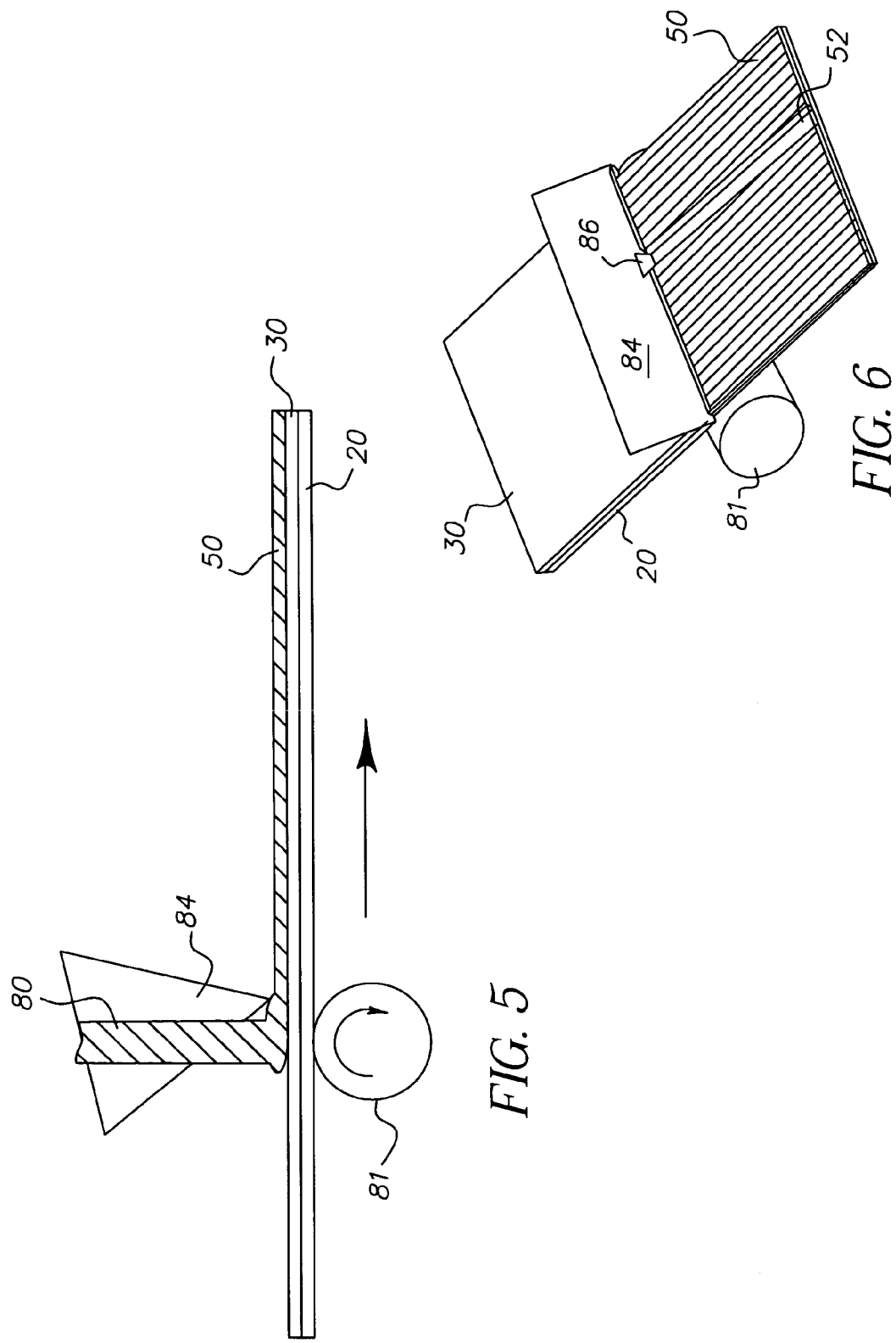

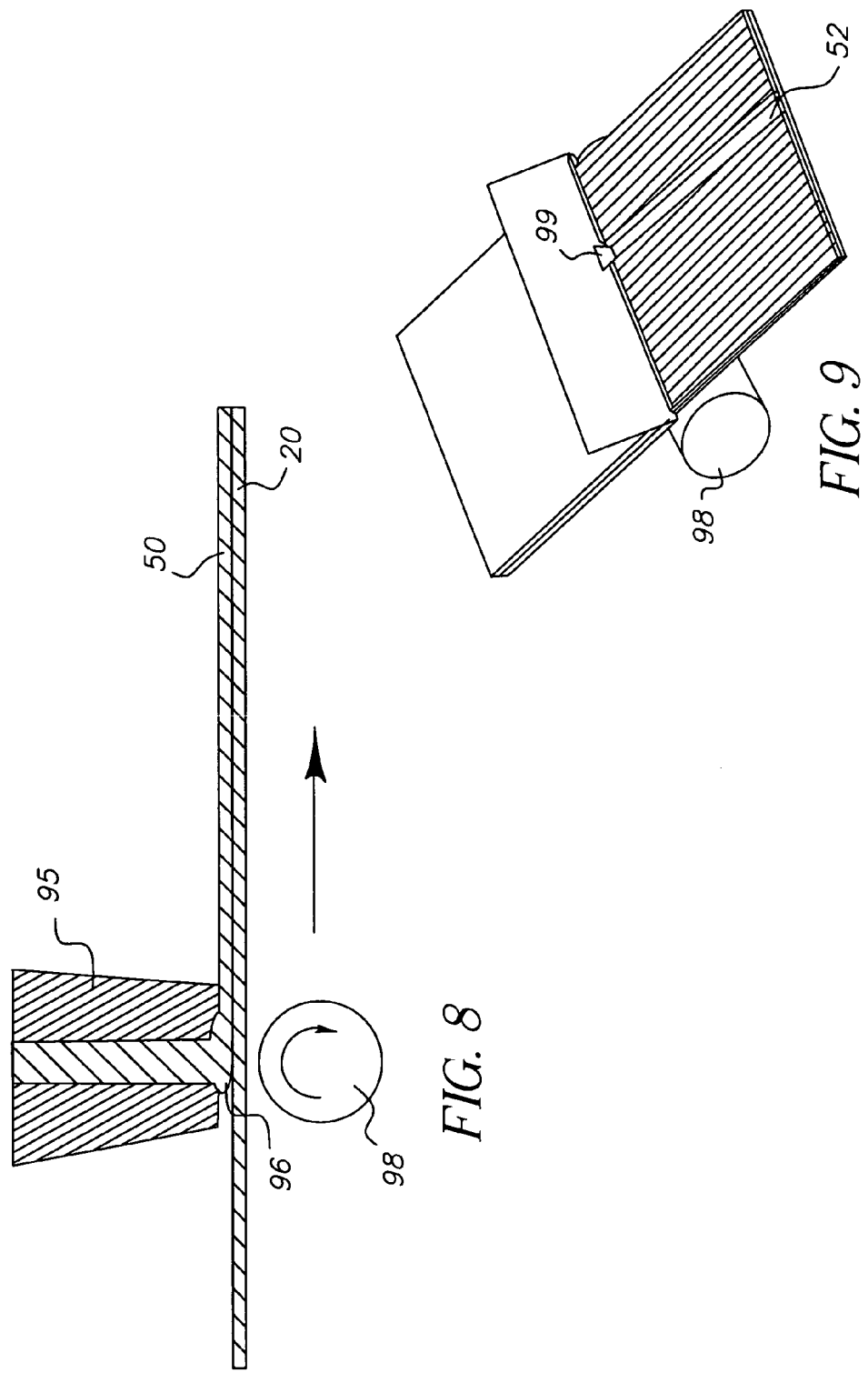

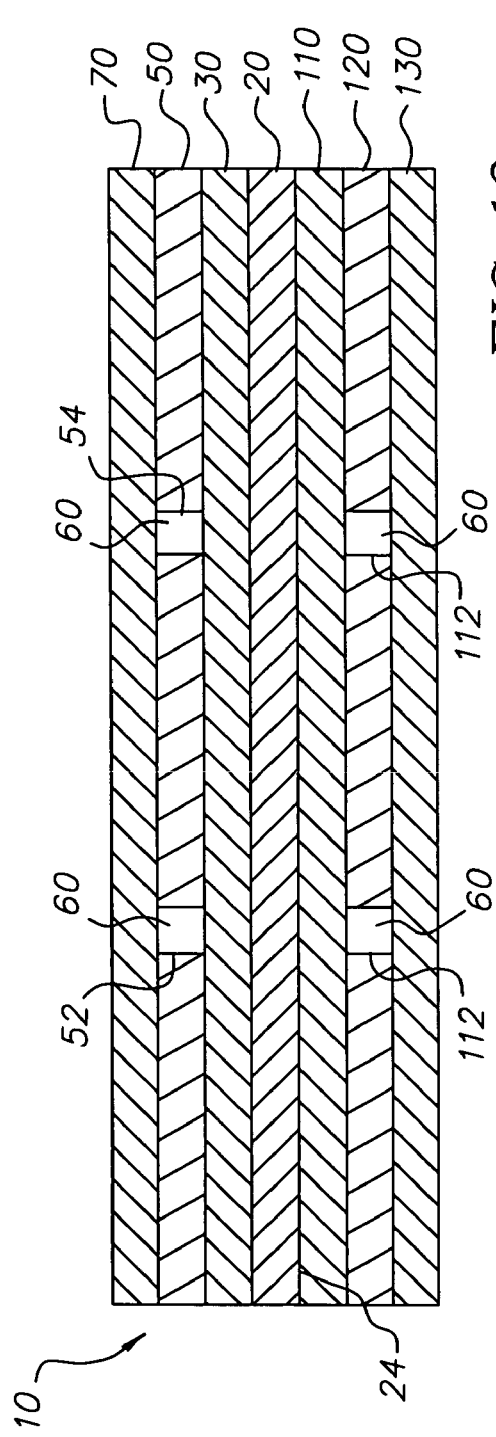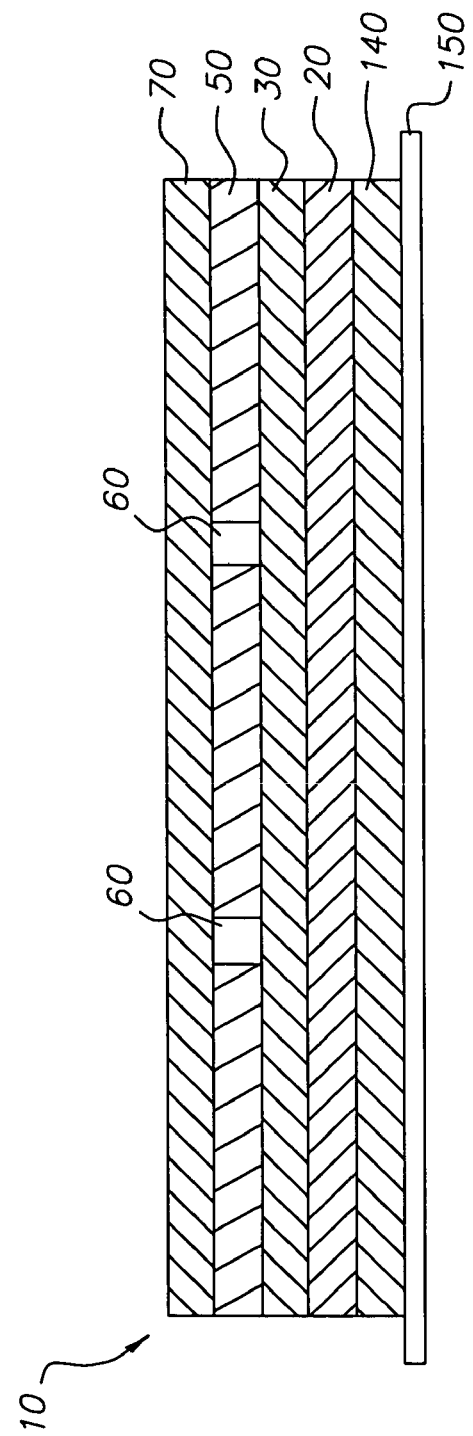
FIG. 12
FIG. 13

MEDIUM HAVING DATA STORAGE AND COMMUNICATION CAPABILITIES AND METHOD FOR FORMING SAME

CROSS REFERENCE TO RELATED APPLICATIONS

Reference is made to commonly assigned copending U.S. patent application Ser. No. 10/256,824 filed Sep. 27, 2002, entitled MEDIUM HAVING DATA STORAGE AND COMMUNICATION CAPABILITIES AND METHOD FOR FORMING SAME, by Kerr et al. and U.S. patent application Ser. No. 10/161,514, entitled VIRTUAL ANNOTATION OF A RECORDING ON AN ARCHIVAL MEDIA by Kerr et al. filed on Sep. 9, 2002.

FIELD OF THE INVENTION

The present invention relates in general to the field of mediums and more particularly to mediums having electronic memory associated therewith.

BACKGROUND OF THE INVENTION

Thin mediums of material such as paper, film and fabric have many useful applications. Often images and information are recorded on such mediums. Where information regarding characteristics of the medium is known in advance of the recording process, the recording process can be adjusted to improve the quality of the recording. Once a recording has been made on a medium it can be useful to associate electronic information in a memory that is associated with the medium. Such electronic information can include information that describes the chain of custody of the medium, the use of the medium, and who has accessed the medium. Radio Frequency Identification (RFID) tags typically comprise three principal elements, an antenna and transponder that cooperate to send and receive electromagnetic fields containing information and a memory that stores information. Other useful information can also be associated with the medium such as electronic information that depicts information recorded on the medium. See for example, commonly assigned U.S. patent application Ser. No. 10/161,514, entitled Virtual Annotation of a Recording on an Archival Media, filed by Kerr et al. on Jun. 3, 2002.

It is known to use Radio Frequency Identification (RFID) tags to provide the electronic memory and communication capabilities that allow electronic information to be associated with a medium.

The RFID tag is adapted to exchange information with a co-designed reading/writing device. Information that is stored in an RFID tag that is joined to an item can later be used to track, identify and process the item. The RFID tag can also store other information that is to be associated with the item. A commercially available "TAG-IT INLAY"™ RFID tag available from Texas Instruments, Incorporated, Dallas, Tex., U.S.A., can be used to provide identifying information about an item to which it is attached. This relatively thin, flexible type of RFID tag can be used in applications that previously required a label or bar code. The RFID tags of the prior art are typically used for identification purposes, such as for employee badges, inventory control, and credit card account identification. The advantage of such RFID tags is that they are small in size, easy to communicate with and unlike a bar coded item, do not require the item to be aligned to the reader or scanner.

RFID tags have been proposed for use in applications with passports and credit cards, such as is disclosed in U.S. Pat. No. 5,528,222 filed by Moskowitz et al. These devices are useful for tracking the location, characteristics and usage of documents, books and packages. For example, such tags can be used to track the location of documents and track the chain of custody of such documents within a document management system.

RFID tags are typically formed into a package such as an inlay, a plastic glass or ceramic housing. The RFID package is then joined to an item such as a document or book after the item has been fully assembled. Typically the RFID tag has an adhesive surface that is used to form a bond between the RFID tag and the item to which it is being joined. It is also known to use other ways of mechanically joining an RFID tag to an item. For example, an RFID tag can be joined to an item using a staple or other mechanical fastener.

There is room for improvement in this arrangement. For example, a poor bond or poor mechanical joint between the RFID tag and the item can result in separation of the RFID tag from the item. This can defeat the purpose of joining the RFID tag to the item. Further, joining an RFID tag to an item increases the cost of the combined RFID tag and item because the RFID tag must include the cost of both the base and the fastener and the cost of labor associated with joining the RFID tag to the item. These costs can become significant where RFID tags are to be joined to a multiplicity of individual items, for example, individual sheets of medium such as film or paper.

Additionally, such RFID tags typically take the form of a patterned antenna located on a base having a transponder unit applied to the top of the antenna. Accordingly, such RFID tags have a non-uniform cross-sectional area. The non-uniform cross-section of the tag can make the tag vulnerable to incidental damage to contact during manufacturing, printing, use, storage and distribution. Further, such RFID tags can interfere with the appearance and the use of the item.

One approach for solving these problems is to incorporate RFID tags inside an item such as an identification badge. In one example, this is done by providing a clam shell type outer casing into which the RFID and antenna electronics are deposited. An example of such an identification badge is the ProxCard II proximity access card sold by HID Corporation, Irvine, Calif., U.S.A. Thinner cards are made by sandwiching the RFID and antenna electronics between sheets of laminate material. An example of such a badge is the ISO ThinCard sold by HID Corporation, Irvine, Calif., U.S.A. While this method of forming a card produces a card that is thinner than the clam shell type card, the card has an uneven cross-section with increased thickness in the area of the RFID electronics.

These techniques, however, are not feasibly applied to the task of forming a thin medium such as paper, film and fabric. Such thin mediums are typically fabricated in high volumes using coating, extrusion and rolling techniques to convert pulp, gelatin or other material into thin sheets of material that are then processed into useful forms. The addition of clam shell type structures known in the art is not practically or economically feasible in this type of production. The alternative lamination approach of the prior art is also not preferred because the increased thickness and uneven cross section caused by the presence of RFID electronics and antenna sandwiched between laminations, can interfere with subsequent fabrication processes causing damage to fabrication equipment and the RFID electronics and or to the medium itself. Further this uneven cross section can interfere with imaging equipment and medium when the laminated medium having an RFID unit is passed through equipment such as a printer that uses a medium after formation. This interference can damage the RFID tag, the medium and the equipment that uses the medium. The uneven cross section also creates a less than desirable appearance for the medium and images that are subsequently recorded thereon.

Thus a need exists for a medium that has the ability to store and electronically exchange data with the medium being compatible with conventional web fabrication processes and post fabrication uses of the medium.

SUMMARY OF THE INVENTION

In one aspect, the present invention comprises a method for forming a medium. A base layer is provided. A material layer having a void is provided on the base layer. A transponder having a memory is positioned in the void.

In another aspect what is provided is a method for forming a medium. In accordance with this method an antenna layer having an antenna is formed on a base layer. A material layer is formed on the antenna layer. The material layer has a void. A transponder having a memory is positioned in the void. The transponder is adapted to cooperate with the antenna when the transponder is positioned in the void.

In yet another aspect what is provided is a method for forming a medium. An antenna layer having an antenna is formed on a base layer. A transponder having a memory and adapted to cooperate with the antenna is provided. A material layer is formed on the antenna layer, with the material layer having a thickness that is at least equal to a thickness of the transponder and having at least one void sized to receive the transponder. The transponder is positioned in the void so that the transponder can cooperate with the antenna.

In still another aspect, a medium is provided. The medium has a base layer and a material layer with the material layer having a void. A transponder having a memory is positioned in the void.

In still another aspect, a medium is provided. The medium has an antenna layer forming an antenna on a base layer. A transponder has a memory and/or interface patterned to cooperate with the antenna. The transponder has a thickness. A material layer on the antenna layer has a void sized to receive the transponder. The transponder is positioned in the void to cooperate with the antenna.

BRIEF DESCRIPTION OF THE DRAWINGS

A more complete understanding of the invention and its advantages will become apparent from the detailed description taken in conjunction with the accompanying drawings, wherein examples of the invention are shown, and identical reference numbers have been used, where possible, to designate identical elements that are common to the figures referenced below:

FIG. 1 shows a cross section view of one embodiment of the medium of the present invention;

FIG. 2 shows an exploded cross-section view of the embodiment of FIG. 1;

FIG. 5 shows a cross section of view of a method for forming a void in a material layer using gap coating;

FIG. 6 shows a perspective view of a method for forming a material layer having a void using gap coating;

FIG. 8 shows a cross-section view of an of a method for forming a material layer having a void using slot die coating;

FIG. 9 shows a perspective view of a method for forming a material layer having a void using slot die coating;

FIG. 12 is a cross-section view of an embodiment of the medium of the present invention having additional antenna, material and overcoat layers;

FIG. 13 is a cross-section view of an embodiment of the medium of the present invention having an adhesive layer;

DETAILED DESCRIPTION OF THE INVENTION

The present invention will be directed in particular to elements forming part of, or in cooperation more directly with the apparatus in accordance with the present invention. It is to be understood that elements not specifically shown or described may take various forms well known to those skilled in the art.

Figure 3:
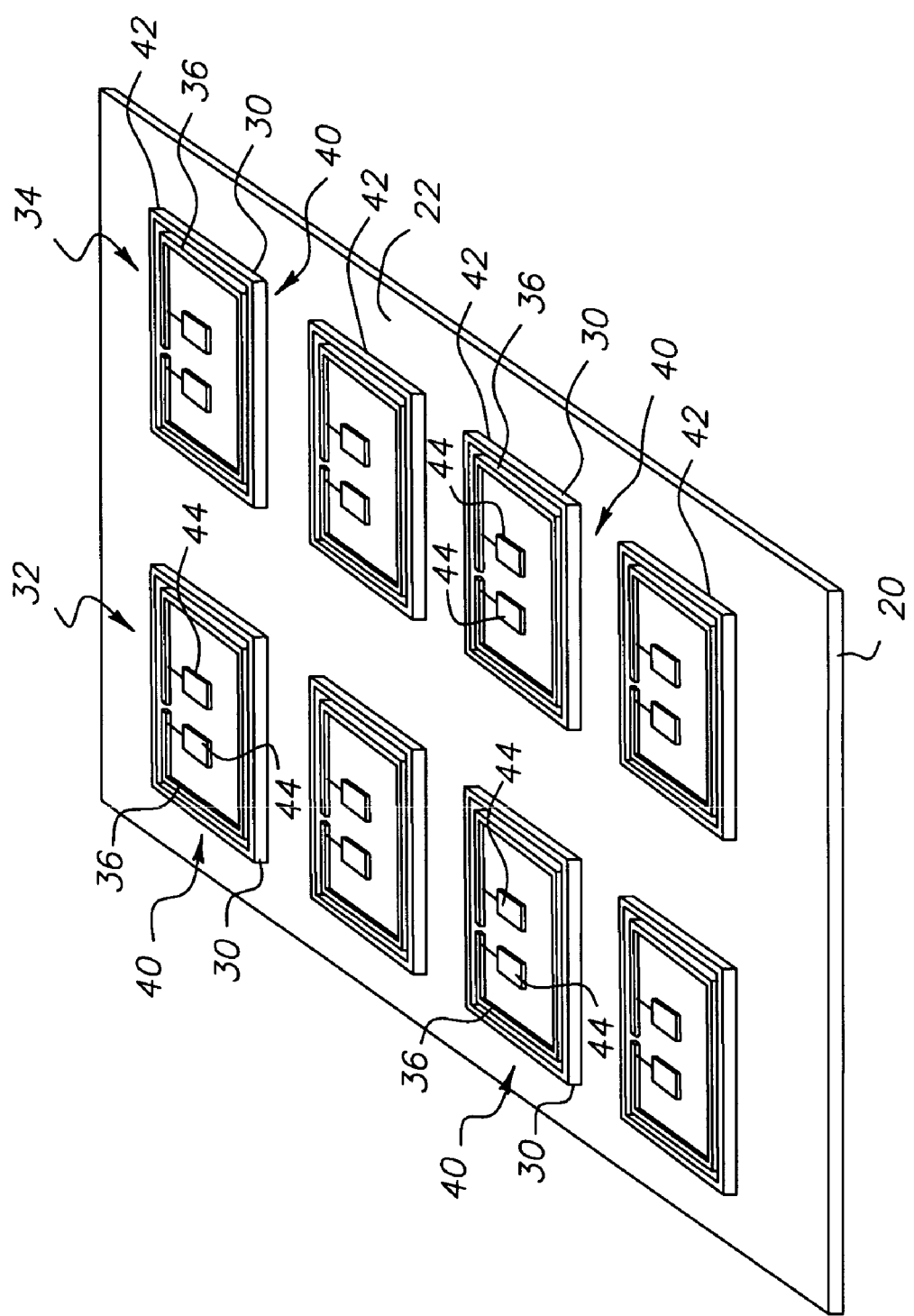
FIG. 3 shows a top perspective view of a base layer having an antenna layer formed thereon.

An embodiment of the present invention will now be shown and described with reference to FIGS. 1–3. FIGS. 1 and 2 respectively show a cross-section view of one embodiment of the medium of the present invention and an exploded cross-section view of the embodiment of FIG. 1. FIG. 3 shows a top right perspective view of a base layer having an antenna layer formed thereon.

As is shown in FIGS. 1 and 2 medium 10 has a base layer 20 having a top surface 22 and a bottom surface 24. Base layer 20 can be formed from a material such as a paper, plastic, metal or other convenient substrate. In certain embodiments, the material used in base layer 20 is selected to receive image forming materials such as inks, dyes, toners, and colorants. This permits images to be formed for example on bottom surface 24 using ink jet printing, thermal printing, contact press printing and other techniques. Alternatively, base layer 20 can also be formed from a material that forms images when exposed to energy such thermal, electrical, optical, electromagnetic or other forms. In a further alternative top surface 22 or bottom surface 24 of base layer 20 can be adapted by chemical or other treatments or coatings to receive images. In the embodiment shown, base layer 20 has a thickness of approximately 100 microns however, the thickness of base layer 20 is not critical.

In the embodiment that is shown in FIGS. 1–3 an optional antenna layer 30 is formed on top surface 22 of base layer 20. Antenna layer 30 typically comprises a material that is capable of being used to form an antenna. Examples of such materials include metals such as copper, aluminum and other materials having electrically conductive properties. Antenna layer 30 has patterned antennas 40 formed therein. FIG. 3 shows a top view of a base layer 20 having patterned antennas 40 applied thereon. In the embodiment shown in FIGS. 1–3 patterned antennas 40 are arranged in a first row of antennas 32 and a second row of antennas 34. Each one of patterned antennas 40 has an antenna section 42 and mating surfaces 44. As is shown in FIG. 3, rows of antennas 32 and 34 extend longitudinally along top surface 22 of base layer 20. However, where medium 10 has two or more patterned antennas 40, such antennas can be arranged on antenna layer 30 in any useful pattern.

As is also shown in FIG. 3 each of patterned antennas 40 is formed from patterns of antenna layer 30 and spaces 36 in antenna layer 30. The arrangement of spaces 36 that form the pattern of material comprising patterned antennas 40 can be formed by applying antenna layer 30 to top surface 22 in a patterned fashion. This can be done for example by using printing, lamination, thermal transfer, or laser thermal transfer techniques to selectively transfer antenna layer 30 to top surface 22. Alternatively, antenna layer 30 can be applied to top surface 22 to form a uniform layer, and portions of antenna layer 30 can be selectively removed to form spaces 36. This selective removal can be done by etching or oblation processes that chemically, optically, thermally remove material from antenna layer 30 to form spaces 36 that define patterned antennas 40.

Mechanical processes can also be used to remove material from antenna layer 30 to form patterned antennas 40.

A material layer 50 is applied to top surface 22 of base layer 20 and/or to antenna layer 30. Material layer 50 can comprise a material including paper, film, polymer or other materials. In one embodiment, material layer 50 is formed from BUTVAR polyvinyl butgral (PVB) resin sold commercially by Solutial, St. Louis, Mo., U.S.A. In the embodiments shown in FIGS. 1 and 2 material layer 50 is adapted to receive image forming substances such as inks, dyes, pigments, colorants, used in the formation of images. Alternatively, material layer 50 can be formed from a material that forms images when exposed to energy such as thermal, electrical optical, electromagnetic or other form. Material layer 50 can also be chemically treated to adapt material layer 50 to receive images or to facilitate modification of the material layer to permit formation of images thereon. As is shown in FIGS. 1 and 2, voids 52 are formed from material layer 50.

Figure 4:
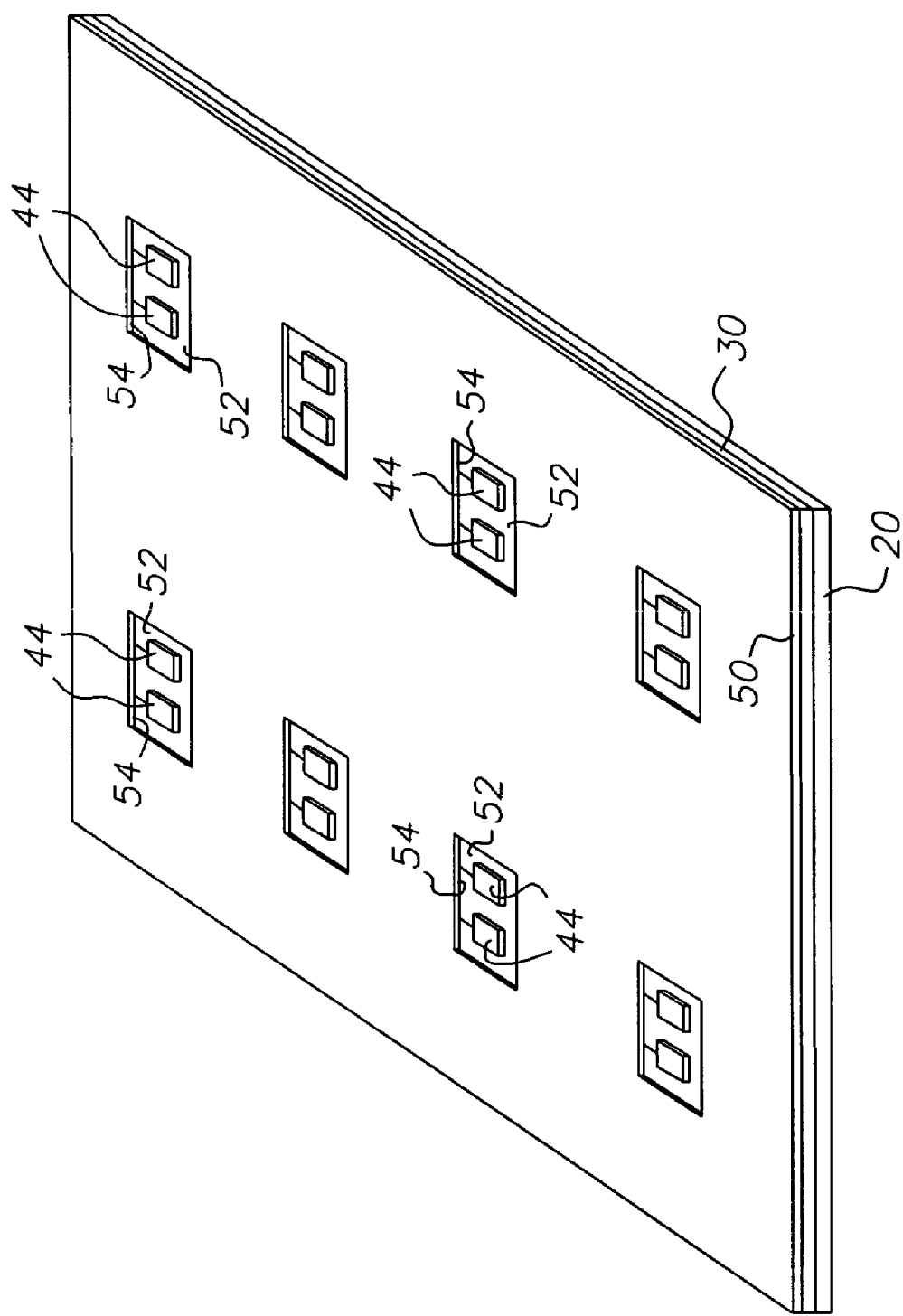
FIG. 4 shows a top perspective view of a base layer having an antenna layer and a material layer formed thereon.

FIG. 4 shows a top perspective view of medium 10 having an antenna layer 30 coated with a material layer 50 having voids 52 formed therein. As will be seen in FIG. 4, voids 52 expose antenna layer 40 so that transponder 60 can engage antenna mating surfaces 44 on antenna layer 40 to cooperate electrically therewith. Antenna engagement surfaces 62 are provided on each of the transponders 60 to engage mating surfaces 44. When transponders 60 are properly inserted in voids 52, antenna engagement surfaces 62 engage mating surfaces 44 to provide an electrical connection between transponders 60 and an antenna such as antenna 32.

Using this electrical connection power supply circuits 61 in transponders 60 can receive electromagnetic signals and convert such signals into power to operates the transponders 60. When transponder 60 is operated, radio frequency communication circuit 63 uses the electrical connection between mating surfaces 44 and antenna engagement surfaces 62 to transmit radio frequency signals that contain data from a memory 65. Radio frequency communication circuit 63 can also be adapted to use the electrical connection between engagement surfaces 62 and antenna mating surfaces 44 to receive radio frequency signals having data and to store the data from such signals in memory 63. In embodiments that do not have an antenna layer, transponder 60 will incorporate an antenna.

In the embodiment shown in FIGS. 1–4 voids 52 are sized to receive transponders 60 having width dimensions 56 and 57 that are at least equal to a width dimension 64 of transponders 60. Alternatively, as will be described in greater detail below, where material layer 50 is formed from a material having a degree of elasticity, the width dimensions 56 and 57 of voids 52 respectively can be undersized with respect to the width dimension 64 of transponders 60. Where voids 52 are undersized, insertion of transponders 60 into voids 52 causes deformation of material layer 50 to allow transponders 60 to be inserted into voids 52. Material layer 50 resists this deformation and applies a force against transponders 60. This force tends to hold transponders 60 within voids 52 and can be used to hold transponders 60 so that engagement surfaces 62 remain in contact with mating surfaces 44 of antennas 40 and do not slide along voids 52 in a manner that would cause separation of engagement surfaces 60 from mating surfaces 44.

In the embodiment shown in FIGS. 1–4, material layer 50 has a thickness 58 that is at least as thick as the thickness 67 of transponders 60. In this way, an outer surface 55 of material layer 50 and outer surfaces 69 of transponders 60 form a common plane A—A to provide a level surface that can be processed without risk of interference with later material handling. This permits the use of useful medium fabrication processes such as rolling or extrusion after transponders 60 have been joined to medium 10 and lowers the risk damage to previous and/or subsequently applied layers of medium 10 where medium 10 is wound onto rolls during further processing. Optionally, the portions of voids 52 that are not occupied by transponders 60 can be filled with material to provide a common plane in other portions of medium 10 and to help secure the position of transponders 60 in voids 52. These unoccupied portions of voids 52 can be filled with additional material of the type used to form material layer 50. These portions can also be filled with other convenient materials such as adhesives.

Alternatively, material layer 50 can have a thickness 58 that is at least greater than the thickness 67 of transponder 60.

A material layer 50 having void 52 can be formed on a base layer 20 and/or on antenna layer 30 using various methods. FIGS. 5–9 show examples of these methods. FIGS. 5 and 6 show an example of a gap coating method. In this method, a supply 80 of material that forms material layer 50 is applied to base layer 20 using a convenient means adapted for such material. Base layer 20 and the supply of material applied to base layer 20 are passed between a roller 81 and limiting structure 84 such as a knife. As the material that forms material layer 50 and base layer 20 passes between roller 81 and limiting structure 84, excess material is scraped off. This provides a uniform material layer 50 on base layer 20. To form a void 52 in base layer 50, a stop 86 is provided in limiting structure 84. Alternatively, stop 86 blocks material forming material layer 50 from passing and creates a void 52 in the material layer 50. Where stop 86 is fixed, void 52 in material layer 50 will have a slot shaped void extending longitudinally along material layer 50. Stop 86 can also be selectively moved into and out of material layer 50 so as to create an intermittent void 52.

Figure 7:
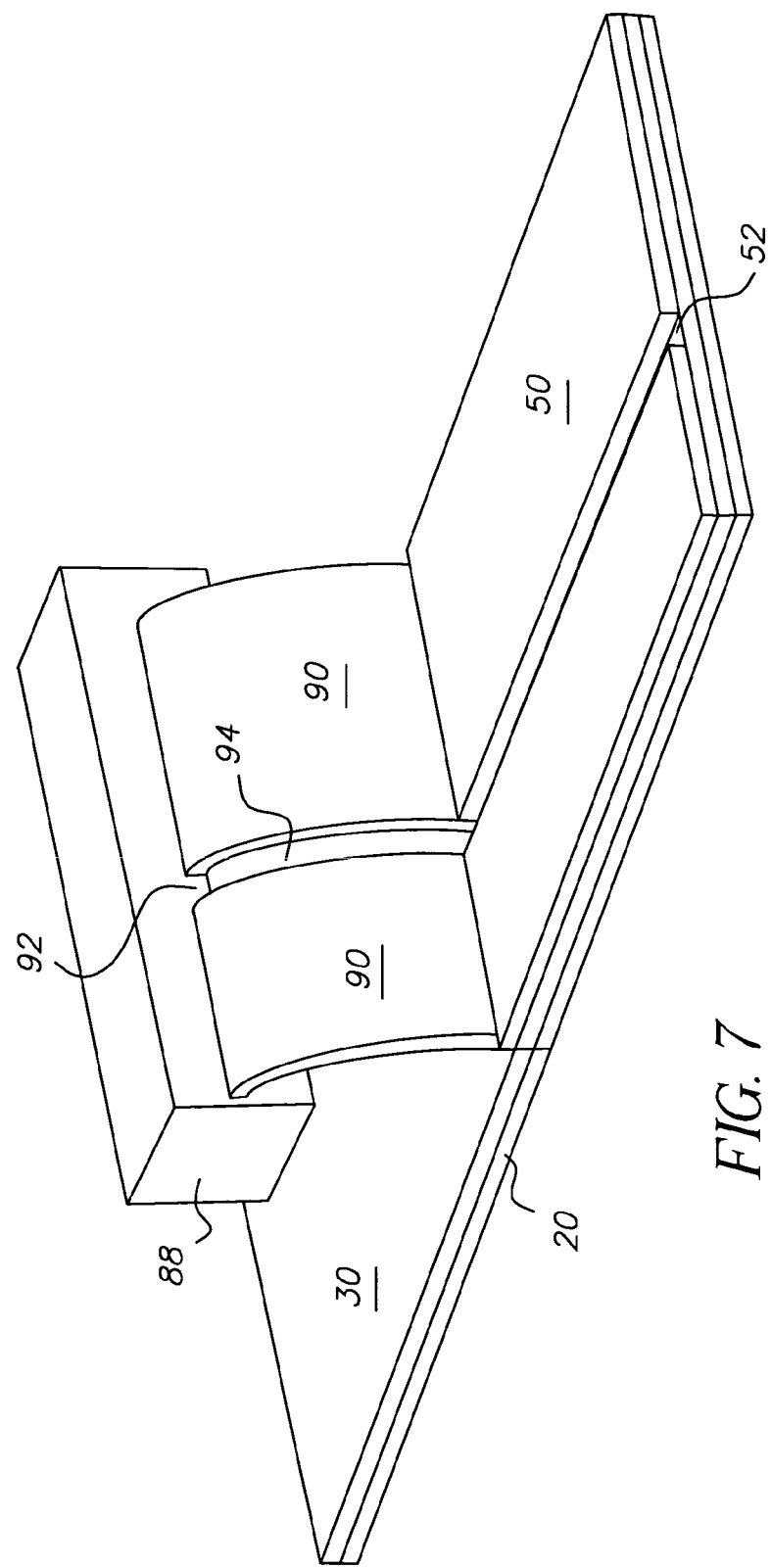
FIG. 7 shows an example of forming a material layer having a void using a curtain coating.

FIG. 7 shows another embodiment of a method for forming a void 52 in a material layer 50 on a base layer 20 using a technique known as curtain coating. In curtain coating, a material to be used to form material layer 50 flows from a supply 88 in a continuous curtain 90 onto base layer 20 as base layer 20 is passed through the flow. A stop 92 interrupts the flow from supply 86 in create a space 94 in continuous curtain 90 which results in a void 52 in material layer 50.

FIGS. 8 and 9 show still another embodiment of a method for forming a void in a material layer 50. In this embodiment, a technique known as slot die coating is used. In this technique, a supply 95 has a slot 96 that ejects material onto base layer 20 to form a material layer 50 thereon as the base 20 is moved relative to slot by a roller 98. A strip 99 interrupts the flow of the material onto base layer 20 creating a void 52 in material layer 50. It will be appreciated that other techniques can also be used to form material layer 50 including but not limited to spraying and printing.

Figure 10:
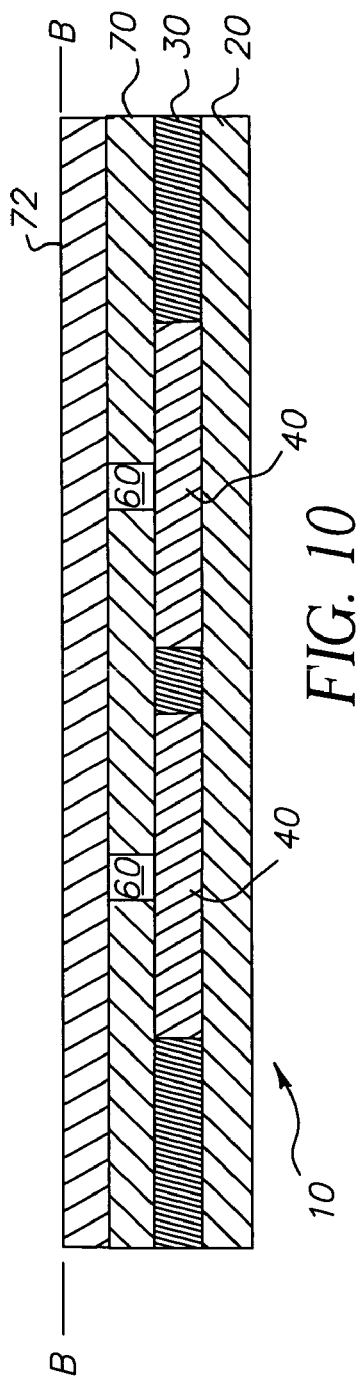
FIG. 10 is a cross-section view of an embodiment of the medium of the present invention having an overcoat layer.
Figure 11:
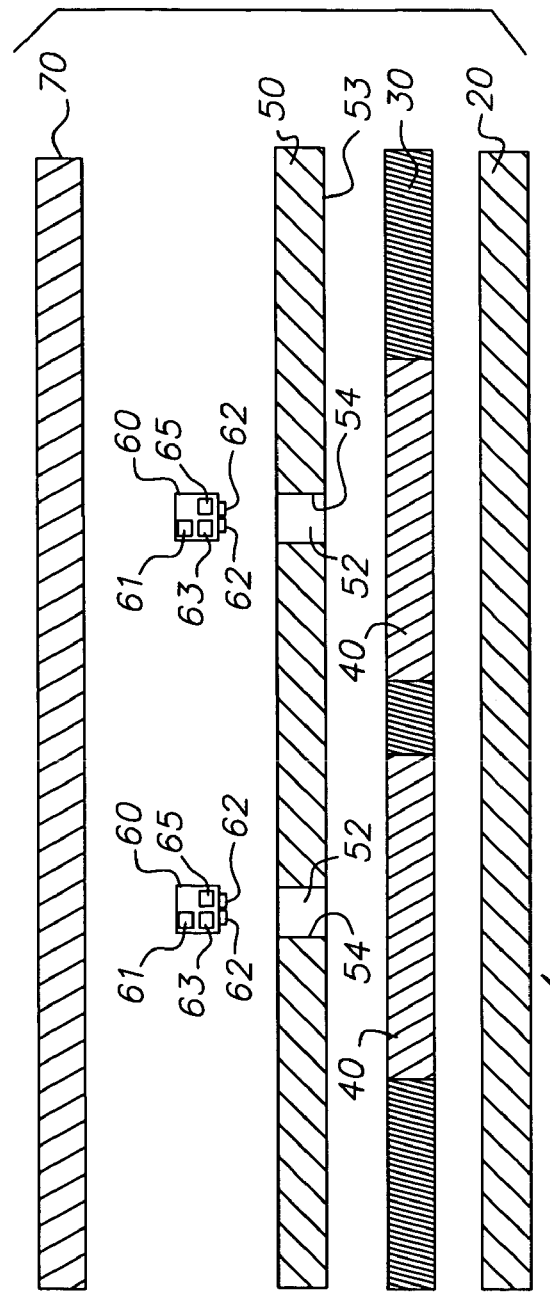
FIG. 11 is a cross-section and exploded view of the embodiment of FIG. 10.

As is shown in FIGS. 10 and 11, in another embodiment, an overcoat layer 70 can be applied to material layer 50. Overcoat layer 70 secures transponders 60 in voids 52. Further, overcoat layer 70 seals and fills material layer 50 so that no portion of antenna layer 40 remains exposed after overcoat layer 70 has been applied. Overcoat layer 70 can be applied to fill portions of voids 52 that are not occupied by transponders 60. This helps to secure transponder 60 and prevent movement of transponder 60 along voids 52. Overcoat layer 70 can be adapted to receive image-forming materials. In the embodiment that is shown in FIGS. 10 and 11, overcoat layer 70 is applied to form an outer surface 72 along plane B—B that does not have protrusions or other non-uniform areas caused by spaces 36, antennas 40, voids 52 and/or transponders 60. Overcoat layer 70 can also be adapted to cushion and protect transponders 60, antennas 40 and medium 20 from chemical, thermal, radiation or mechanical damage during handling or manipulation of medium 20.

Where an overcoat layer 70 is used, it is not essential that material layer 50 has a thickness that is at least as great as the thickness of transponders 60. This is because a common plane e.g. B—B can be formed by an outer surface 72 of overcoat layer 70 wherein overcoat layer 70 is applied to a thickness that, in combination with material layer 50 has a thickness that is at least as thick as the thickness of transponders 60.

Where material layer 50 is adapted to receive image forming materials and such image forming materials can be applied to form images on material layer 50 before overcoat layer 70 is formed. In one such embodiment, overcoat layer 70 can comprise a transparent material that blocks the flow of ultraviolet or other forms of radiation, that provides protection against mechanical, thermal, chemical or other factors that may damage the appearance of the images formed on material layer 50.

As is shown in FIG. 12, an additional antenna layer 110 can be formed on bottom surface 24 of base layer 20. Additional antenna layer 110 can be formed in the manner described above with respect to forming antenna layer 40. Similarly, an additional material layer 120 can be applied to additional antenna layer 110 with voids 112 formed therein. Voids 112 are adapted to receive transponders 60 and otherwise are similar to voids 52 as described above. As is also shown in FIG. 12 an additional overcoat layer 130 can optionally be applied to additional material layer 90.

Medium 10 is free of protrusions, thus medium 10 can be further processed as necessary using conventional web forming techniques such as winding, rolling, extruding and printing can be applied to medium 10 after transponder 60 has been positioned in the material layer of medium 10. For example, a medium 10 having a transponders 60 attached thereto can be slit and wound onto rolls with each roll having at least one transponder 60. Medium 10 can also be slit and chopped into sheet form with each sheet having a transponder 60 associated therewith.

As is shown in FIG. 13, an adhesive layer 140 can be applied to base layer 20 of medium 10 to permit medium 10 to be easily applied to a tangible thing such as a bottle. An advantage of such a medium is that a label can be provided that does not have a protrusion that might interfere with or be easily damaged by use and handling of the tangible thing to which the medium is attached. To facilitate handling of this adhesive embodiment of medium 10, a removable layer 150 can be applied to adhesive layer 140.

In any embodiment, transponder 60 can be formed in whole or in part by depositing circuit forming material on medium 20. For example, transponder 30 can be formed on base layer 20, antenna layer 30, or in antenna layer 30 using lithographic, ink jet and other technologies that permit electronic circuits to be formed on a substrate.

In any embodiment, voids 52 can incorporate void walls 54 that are shaped to align or otherwise position transponder 60 so that the antenna engagement surfaces 62 can engage mating surfaces 44 to provide an electrical connection between transponders 60 and an antenna such as antenna 32. The shape of void walls 54 can be matched to a particular footprint of a particular transponder 60.

Figure 14:
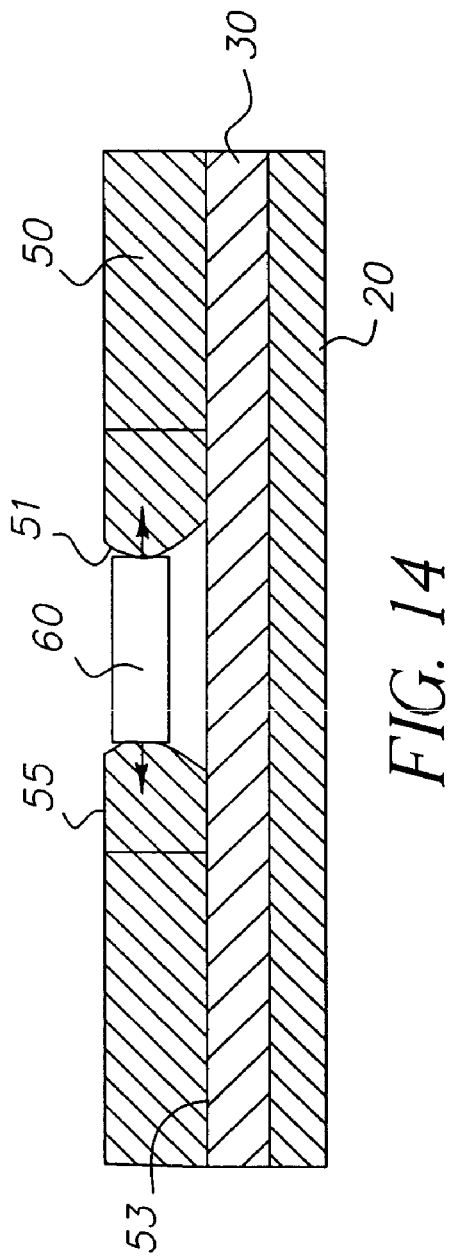
FIGS. 14 and 15 show cross sectional views of a void having walls that are shaped with features to help receive and to hold a transponder in the void.
Figure 15:
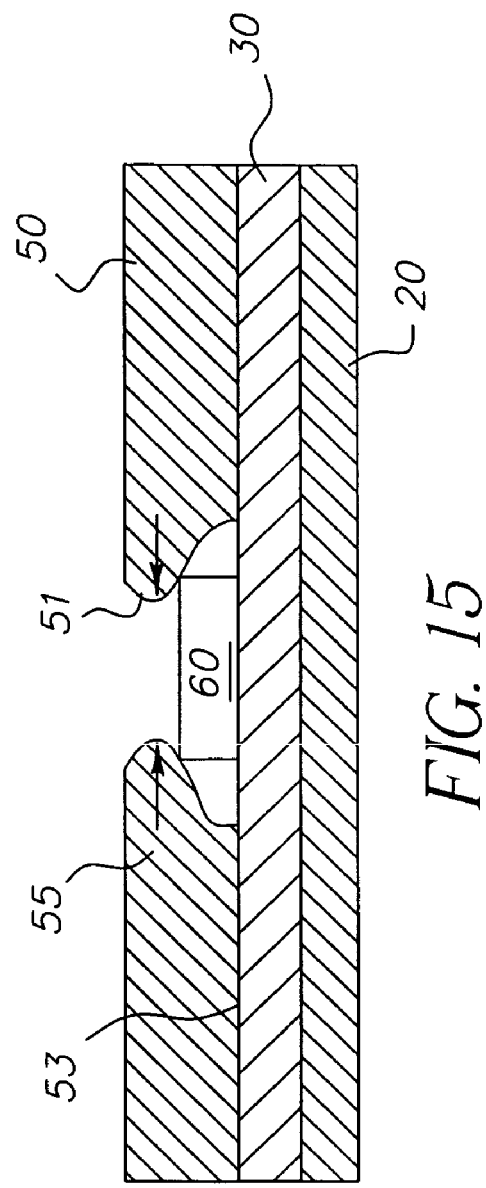

FIGS. 14 and 15 show cross sectional views of a void 52 having void walls 54 that are shaped with features to help receive and to hold transponder 60 in void 52. As is shown, in FIGS. 14 and 15 void walls 54 are narrower near outer surface 55 and wider near inner surface 53. In this embodiment, material layer 50 is made from a material that permits some degree of elastic deformation. Accordingly, as shown in FIG. 11 when a transponder 60 is pressed into the portion of void walls 54 that is near outer surface 55, material layer 50 deforms to accept transponder 60 into the portion of void walls 54 that is near inner surface 55. The portion of void walls 54 near to the top surface of material layer 52 then elastically expands as shown in FIG. 15 to capture transponder 30 in material layer 52 in an area proximate to antenna layer 30.

The invention has been described in detail with particular reference to certain preferred embodiments thereof, but it will be understood that variations and modifications can be effected within the spirit and scope of the invention.

PARTS LIST 10 medium
20 base layer
22 top surface of base layer
24 bottom surface of base layer
30 antenna layer
32 first row of antennas
34 second row of antennas
36 spaces in antenna layer
40 patterned antennas
42 antenna section
44 mating surfaces
50 material layer
52 voids
53 inner surface
55 outer surface
56 width dimension of void
57 width dimension of void
58 thickness of material layer
59 outer surface
60 transponder
61 power supply circuit
62 engagement surface
63 radio frequency communication circuit
64 width dimension of transponder
65 memory
66 Top surface of transponder 67 thickness of transponder
69 outer surface of material layer
70 overcoat layer
72 outer surface of overcoat layer
80 supply
81 roller
84 limiting structure
86 stop
88 supply
90 curtain
92 stop
94 space
95 supply
96 slot
98 roller
99 strip
110 additional antenna layer
112 voids
120 additional material layer
130 additional overcoat layer
140 adhesive layer
150 removable layer

What is claimed is:

1. A medium comprising:
an antenna layer forming an antenna on a base layer;
a transponder with having a memory and an interface patterned to cooperate with the antenna, the transponder having a thickness;
a material layer on the antenna layer, the material layer having a void sized to receive the transponder; and
an overcoat layer on the material layer with the overcoat layer adapted to permit the formation of an image thereon,
wherein the void has void walls that are formed from an elastic material and arranged so that the void walls are elastically deformed during insertion of a transponder into the void and respond to the elastic deformation in a manner that holds the transponder in the void with the transponder positioned in the void to cooperate with the antenna; and
wherein said void walls define a void with an outer portion near an outer surface of the material layer and an inner portion proximate to an inner surface of the material layer near an antenna, said outer portion having a width that is less than a width of the transponder so that as the transponder is inserted into the outer portion, the outer portion elastically deforms to allow the transponder to pass into the inner portion and then expands to capture the transponder.

2. The medium of claim 1, wherein said antenna comprises an antenna forming material.

3. The medium of claim 1, wherein the antenna layer comprises a layer of antenna material having an etched antenna pattern.

4. The medium of claim 1, further comprising an overcoat layer on the base layer opposite the material layer, said overcoat layer adapted to permit the formation of an image thereon.

5. The medium of claim 1, further comprising an adhesive layer.

6. The medium of claim 1, wherein said transponder has a thickness within a predefined range and said material layer has a thickness at least equal to a thickness of the transponder.

7. The medium of claim 1, wherein said base layer has a bottom surface adapted to permit the formation of an image thereon.

8. The medium of claim 1, wherein said base layer has a bottom surface coated with a material upon which an image can be formed.

9. The medium of claim 1, wherein said material layer is formed from a material that permits the formation of an image thereon.

10. The medium of claim 1, wherein the base layer is formed from a material that permits an image to be formed thereon.

11. The medium of claim 1, wherein said antenna layer is printed onto the base layer.

12. The medium of claim 1, wherein said overcoat layer is adapted to provide protection against at least one of chemical, radiation, mechanical, electrical or optical damage.

* * * * *